United States Patent [19]

Osbond et al.

[11] Patent Number: 4,869,840

[45] Date of Patent: Sep. 26, 1989

[54] PYROELECTRIC CERAMICS

[75] Inventors: Paul C. Osbond; Catherine S. Oswald, both of Northampton; Roger W. Whatmore, Bletchley, all of England

[73] Assignee: Plessey Overseas Limited, Ilford, England

[21] Appl. No.: 170,471

[22] Filed: Mar. 21, 1988

Related U.S. Application Data

[63] Continuation of Ser. No. 839,008, Mar. 12, 1986, abandoned.

[30] Foreign Application Priority Data

Mar. 15, 1985 [GB] United Kingdom ................ 8506805

[51] Int. Cl.$^4$ .................... C04B 35/48; C04B 35/49
[52] U.S. Cl. .................... 252/62.9; 250/338.3; 501/135; 501/136; 501/152
[58] Field of Search ............... 252/62.9; 501/135, 136; 250/338.3

[56] References Cited

U.S. PATENT DOCUMENTS

| | | | |
|---|---|---|---|
| 3,006,857 | 10/1961 | Kulcsar | 252/62.9 |
| 3,518,199 | 6/1970 | Tsubouchi et al. | 252/62.9 |
| 3,816,750 | 6/1974 | Liu | 252/62.9 |

FOREIGN PATENT DOCUMENTS 48-6360  2/1973  Japan ................... 252/62.9

*Primary Examiner*—Jack Cooper
*Attorney, Agent, or Firm*—Fleit, Jacobson, Cohn, Price, Holman & Stern

[57] ABSTRACT

A pyroelectric ceramic having the composition:

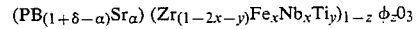

$$(Pb_{(1+\delta-\alpha)}Sr_\alpha)(Zr_{(1-2x-y)}Fe_xNb_xTi_y)_{1-z}\phi_zO_3$$

where $\phi$ is U (uranium) or Mn (manganese) and in which $\alpha$ is a number substantially within the range 0.01 to 0.10; x is a number substantially within the range 0.10 to 0.25; y is a number substantially within the range 0 to 0.4; z is a number substantially within the range 0 to 0.05 and $\delta$ is a number substantially within the range 0 to 0.06. Methods of fabricating the pyroelectric ceramic are also described.

2 Claims, No Drawings

PYROELECTRIC CERAMICS

This is a continuation of application Ser. No. 839,008 filed Mar. 12, 1986 now abandoned.

BACKGROUND OF THE INVENTION

The present invention relates to pyroelectric ceramics and more particularly to a pyroelectric ceramic incorporating strontium and to methods for fabricating the ceramic.

Several figures of merit are used to compare the properties of pyroelectric materials:

$$F_i = \frac{P}{C} \quad F_V = \frac{P}{C\epsilon\epsilon_o} \quad \text{and} \quad F_D = \frac{P}{C(\epsilon\epsilon_o\tan\delta)^{\frac{1}{2}}}$$

$F_i$ and $F_V$ determine the current and voltage responsivity respectively. $F_D$ determines the signal to noise ratio, where Johnson noise dominates. From these figures of merit favourable material characteristics are dependent on a high pyrocoefficient $P=(dPs/dT)$ (where Ps=polarisation, T=temperature), a low volume specific heat capacity c and a low dielectric constant and loss, $\epsilon$ and tan $\delta$ respectively. Uniform response over a specified temperature and frequency range must also be considered in choosing a suitable material. In addition to the figures of merit, important features are the mechanical properties of the material and the ease with which the material can be produced and processed. Ceramics developed from $PbZrO_3$–$PbTiO_3$ solid solutions exhibit several desirable qualities, not least of which is the way in which the properties may be adapted to suit a particular application, by adjusting the composition of the ceramic. Undoped $PbZrO_3$ is antiferroelectric, the perovskite structure being based upon two interpenetrating sublattices, whose directions of polarisation are opposed, so there is no net polarisation in the antiferroelectric phase. When titanium is added, as titanium oxide $TiO_2$, making a solid solution of $PbZrO_3$–$PbTiO_3$ the result is a ferroelectric ceramic with a perovskite structure in which some of the B site $Zr^{4+}$ ions have been substituted by $Ti^{4+}$ ions. The effect of increasing the concentration of $Ti^{4+}$ is to increase the transition temperature $T_o$, that is the temperature at which the spontaneous dielectric polarisation goes to zero, and to make the first order ferroelectric to paraelectric phase transistion behave more like a second order transition.

Addition of $Ti^{+4}$ to the composition improves the uniformity of the detector response over a temperature range −40° to 70° C. Increasing $Ti^{4+}$ concentration also engenders an increase in spontaneous polarisation. The quantity of $Ti^{4+}$ chosen is governed by the transition temperature $T_o$ required. For a pyroelectric material operating over a given temperature range one requires a high transition temperature such that the material remains poled and shows a uniform response. $T_o$ must not be too high, however, as the figures of merit deteriorate at temperatures further away from the transition temperature. The pyrocoefficient is given by the gradient of the polarisation/temperature curve. For a first or second order transition this gradient increases as the Curie point is approached. The dielectric constant $\epsilon$ also increases as temperature is increased towards the Curie point, but a maximum value for the ratio $P/\epsilon^{\frac{1}{2}}$ can be found to give an optimum value for the figure of merit $F_D$. This is explained in an article by R.W. Whatmore and F.W. Ainger entitled "Piezoelectric Ceramics for uncooled Infra-Red Detectors" appearing in Advanced Infra-Red Sensor Technology. Proc. SPIE 395 pp. 261–6 (1983). Iron and niobium oxides were added in sufficient quantities to remove a ferroelectric rhombohedral to rhombohedral phase transition at about 50° C.

The most directly controllable property is resistivity which is lowered if sufficient uranium ions $U^{6+}$ are substituted onto the B site of the perovskite structure. The conductivity mechanism below 0.4 mole ratio % $U^{6+}$ is thought to be controlled by lead $Pb^{2+}$ vacancies acting as acceptor centres, holes being the majority charge carriers. Above 0.4 mole ratio % $U^{6+}$ doping, however, $U^{6+}$ acts as an electron donor and electrons are the dominant charge carriers. Off-valent $U^{6+}$ also influence the dielectric properties possibly by stabilising the domain walls, thus reducing the dielectric constant and loss. (The mole ratio % referred to hereafter as mr %, of a ceramic constituent is defined as the number of gram-moles of the constituent per gram-mole of the ceramic).

SUMMARY OF THE INVENTION

One of the objects of the present invention is to provide a pyroelectric material, exhibiting figures of merit improved over the materials described above, and which is suitable for application in infra-red detectors. To this end we have found that suitable pyroelectric materials can be obtained by introducing strontium into ceramic solid solution compositions based on those described above.

According to the present invention there is provided a pyroelectric ceramic having the composition:

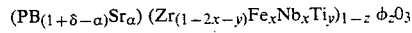

$$(PB_{(1+\delta-\alpha)}Sr_\alpha)(Zr_{(1-2x-y)}Fe_xNb_xTi_y)_{1-z}\phi_zO_3$$

where $\phi$ is U (Uranium) or Mn (Manganese) or a combination of U or Mn and in which $\alpha$ is a number substantially within the range 0.01 to 0.10; x is a number substantially within the range 0.10 to 0.25; y is a number substantially within the range 0 to 0.4; z is a number substantially within the range 0 to 0.05 and $\delta$ is a number substantially within the range 0 to 0.06.

A feature of the present invention is the provision of an Infra-Red detector the detecting element of which includes an pyroelectric ceramic having the above defined composition.

The present invention also provides a method of fabricating a pyroelectric ceramic having the above defined composition, the method comprising the steps of:

forming a slurry of metal oxides in a liquid, the metal oxides including oxides of lead, zirconium, iron, titanium, uranium and/or manganese, niobium and strontium; drying the slurry and sieving the resulting dried material into a first powder;

heating the first powder to a first temperature and maintaining the first powder substantially at the first temperature for a predetermined period;

forming a slurry of the first powder in a liquid, drying the slurry and sieving the resulting dried material into a second powder;

forming a slurry of the second powder with an organic binder, drying the slurry and sieving the resulting dried material into a third powder;

compressing a slug of the third powder in a die;

heating the compressed slug in another die to a second temperature and maintaining the compressed slug substantially at the second temperature for a further predetermined period to burn out the organic binder;

further heating the compressed slug to a third temperature higher than the second temperature and under pressure to compact and sinter the powder into a dense ceramic body.

In a preferred embodiment of the present invention the metal oxides are PbO, ZrO$_2$, Fe$_2$O$_3$, TiO$_2$, UO$_3$, Nb$_2$O$_5$ and SrCO$_3$. If manganese is used the metal oxides may include MnCO$_3$, MnO, Mn$_2$O$_3$ or MnO$_2$.

In one embodiment of the present invention the method of fabrication comprises the step of forming the slurry of metal oxides in acetone, the metal oxides being milled in the acetone using zirconia milling elements.

In one embodiment of the present invention the first temperature is approximately 800° C. and the first powder is maintained at the first temperature for approximately five hours, the second temperature is approximately 500° C., said further predetermined period to burn out the organic binder is approximately 2 hours and the third temperature is higher than 500° C.

In another embodiment of the present invention the method of fabrication includes the step of first taking the necessary metals into solution as alkoxides, acetates or a combination of these subsequently precipitated as hydroxides which are then heated to form the metal oxides.

In another embodiment of the present invention the method of fabrication includes the step of taking ions of the necessary metals into solution as citrates, from which the metal oxides can be prepared by drying the citrate solution to a resin and subsequently heating the resin to form the oxides.

In another embodiment the method of fabrication includes the step of forming a billet from the third powder and sintering the billet to produce the dense ceramic body.

DESCRIPTION OF PREFERRED EMBODIMENTS

We have discovered that the introduction of strontium in the composition lowers the Curie temperature and obtains in one embodiment a pyroelectric ceramic having a pyrocoefficient value of approximately 6 x 10$^{-4}$ Cm$^{-2}$ K$^{-1}$. We have also discovered that the pyroelectric coefficient P at a constant temperature increases with the strontium content. This is due to a reduction in Curie temperature of the first order ferroelectric-paraelectric transistion, bringing the transition temperature closer to the operating range. The position of the Curie temperature relative to the operating range can be controlled by doping with the amount of strontium corresponding to that estimated from TABLE 1 below which sets out the relevant data associated with a strontium doped lead zirconate pyroelectric ceramic having the composition:

$$\begin{pmatrix} Pb & Sr \\ 1+\delta-\alpha & \alpha \end{pmatrix} \begin{pmatrix} Zr & Fe & Nb & Ti \\ (1-2x-y) & x & x & y \end{pmatrix} \begin{matrix} U & O \\ 1-z & z & 3 \end{matrix} \quad (1)$$

in which
$\alpha = 0.01 - 0.10$
$x = 0.2$
$y = 0.02$
$z = 0.005$
$\delta = 0.02$ substituting the values of x,y,z and δ into formula 1 gives the composition:

TABLE 1

Pb Sr (Zr Fe Nb Ti) U O
(1.02-α) α 0.58 0.20 0.20 0.20 0.995 0.005 3

| MATERIAL CODE | MOLE RATIO % Sr (α × 100) | DIELETRIC CONSTANT ε (at 1592 Hz) BEFORE POLING | AFTER POLING | DIELETRIC LOSS TAN δ (10$^{-3}$) (at 1592 Hz) BEFORE POLING | AFTER POLING | PYRO-ELECTRIC COEFFICIENT P(10$^{-4}$ Cm$^{-2}$K$^{-1}$) | FIGURE OF MERIT F$_D$(10$^{-5}$ Pa$^{\frac{1}{2}}$) | GRAIN SIZE (μm) | CURIE TEMP. (°C.) |
|---|---|---|---|---|---|---|---|---|---|
| RM100 | 0 | 319 | 291 | 4.0 | 3.1 | 3.9 | 4.9 | 12 | 228 |
| PSN2 | 2 | 419 | 378 | 5.3 | 3.1 | 4.3 | 4.8 | 12(edge) | 198 |
| PSN4 | 4 | 516 | 398 | 6.8 | 2.8 | 4.9 | 5.5 | 12 edge 5 centre | 166 |
| PSN6 | 6 | 721 | 569 | 7.2 | 3.3 | 5.3 | 4.6 | 6 edge 4 centre | 132 |
| PSN8 | 8 | 1276 | 881 | 11.5 | 7.2 | 6.9 | 3.3 | 5 edge 4 centre | 107 |

The doped compositions investigated and set out in TABLE 1 contain 2, 4, 6, 8 mr % strontium and the nomenclature ascribed to each composition indicates some of the constituent elements and the amount of mr % Sr substituted onto the A site of the perovskite structure e.g. PSN4 contains 4 mr % Sr. The strontium doped compositions will hereinafter be referred to as the PSN-series compositions.

The variations of room temperature dielectric constant and loss in the PSN-series ceramics before and after poling are given in TABLE 1. There is a gradual increase in dielectric constant with strontium content, the increase becoming more rapid above 4 mr % Sr. It is to be noted that there is a larger difference between the before-and-after poling values for the lower T$_o$ compositions. The latter is also true for tan δ, except that the poled tan δ is found to be virtually independent of composition from 0 to 6 mr % Sr, rising rapidly above this figure. It is probable that the unpoled dielectric properties will show a large contribution from the motion of ferroelectric domain walls under the application of the a.c. field. The lower T$_o$ compositions would be expected to possess higher domain wall mobilities and thus higher dielectric constants and losses. This also explains the larger changes on poling seen in ε and tan δ for the lower T$_o$ compositions. The composition-independence of the poled tan δ up to PSN6 implies that most domain walls have been eliminated by poling and that the residual loss is probably due to some other effect, which may be microstructural in origin although the motion of residual domain walls may still contribute to the loss even after poling.

The variation of $T_o$ with the strontium doping level (in formula (1) above) is shown in Table 1. It can be seen that $T_o$ decreases substantially monotonically with $\alpha$. It can also be seen from this that the decreasing $T_o$ results in a pyroelectric coefficient which increases linearly with increasing Sr concentration up to $\delta=0.06$, giving a value of $4.9\ (\pm 0.1)\times 10^{-4}\ CM^{-2}K^{-1}$ for PSN4. This is a 30% improvement for material in which $\alpha=o$.

An optimum doping level was found to be 4 mr % Sr where the figure of merit maximised at $5.5\ (\pm 0.5)\times 10^{-5} Pa^{\frac{1}{2}}$. Ageing tests showed that this material maintained this figure of merit after being heated to 110° C.

In other embodiments of the present invention the composition in formula 1 may have a value of x falling in the range 0.10 to 0.25, a value of y falling in the range 0 to 0.4, a value of z falling in the range 0 to 0.01, a value of $\delta$ falling in the range 0 to 0.06 and a value of $\alpha$ falling in the range 0.01 to 0.10.

One method of fabrication of pyroelectric ceramics of embodiments of the present invention includes the steps of:

1. Metal oxides (PbO $ZrO_2Fe_2O_3$, $TiO_2$, $UO_3$, $Nb_2O_5$, $SrCO_3$) milled for 1 hour in acetone using zirconia milling elements.
2. Slurry air dried at 60° C. and sieved through 355$\mu$m mesh.
3. First calcine at 800° C. for 5 hours.
4. Second mill for 4 hours in acetone.
5. Dry and sieve.
6. Second calcine at 900° C. for 5 hours.
7. Third mill for 4 hours in acetone.
8. Dry and sieve.
9. Add an organic binder, for example CRANCO (a trade mark).
10. Dry and sieve
11. 70g slug of powder cold pressed at 10 t.s.i. in 30 mm die (see below).
12. Slug mounted in 38 mm $Si_3N_4$ die surrounded by alumina placed in furnace (see below).
13. Furnace heated to 500° C. at rate 300° C. hour$^{-1}$ and held for 2 hours to burn out binder.
14. Furnace heated to 1190° C. at rate 600° C. hour$^{-1}$. Pressure is applied at 800° C. for 6 hours and temperature reduced at 100° C. hour$^{-1}$.

It is to be understood that the pressing sizes given above are examples only. Larger or smaller sizes can be used if the weights of ceramic powder, alumina grits and sizes of diesets are scaled-up or down proportionately.

In a feasible variation of the above process, items 6, 7 and 8 can be omitted. This produces a finer-grained ceramic material.

In a second feasible variation of the technique described above, the metals are first taken into solution as alkoxides, subsequently precipitated as hydroxides which are then calcined to form the mixed oxides.

In a third variation of the above process, the metal ions ar taken into solution as citrates, from which the oxides can be prepared by drying the citrate solution to a resin and subsequently calcining the resin to form the oxides.

Pyroelectric ceramics having compositions in accordance with the present invention are particularly suitable as infra-red detecting elements in infra-red detecting devices.

We claim:

1. A pyroelectric ceramic suitable for use as an infrared detecting element, the pyroelectric ceramic having the composition:

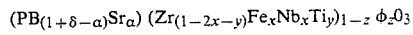

where $\phi$ is U (uranium) or Mn (Manganese) or a combination of U or Mn and in which $\alpha$ is a number within the range 0.01 to 0.10; x is a number within the range 0.10 to 0.25; y is a number within the range 0 to 0.4; z is a number within the range 0 to 0.05 and $\delta$ is a number within the range 0 to 0.06 and exhibiting a higher pyroelectric coefficient and a lower Curie temperature than said ceramic absent Sr.

2. An infra-red detecting element comprising a pyroelectric ceramic having the composition according to claim 1.

* * * * *